United States Patent
Tanaka

(10) Patent No.: US 6,320,322 B1
(45) Date of Patent: Nov. 20, 2001

(54) LIGHT EMITTING APPLIANCE

(75) Inventor: Haruo Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/469,349

(22) Filed: Dec. 22, 1999

(30) Foreign Application Priority Data

Dec. 24, 1998 (JP) .................................................. 10-367808

(51) Int. Cl.[7] ...................................................... G09G 3/10
(52) U.S. Cl. .................................... 315/169.3; 315/169.1; 345/46
(58) Field of Search ............................. 315/169.1, 169.3, 315/169.4; 257/88; 345/44, 46, 82, 83

(56) References Cited

U.S. PATENT DOCUMENTS

| | | | |
|---|---|---|---|
| 4,420,711 | * 12/1983 | Takahashi et al. | 315/296 |
| 5,625,201 | * 4/1997 | Holm et al. | 257/88 |
| 5,703,436 | 12/1997 | Forrest et al. | 313/506 |
| 5,707,745 | 1/1998 | Forrest et al. | 428/432 |
| 5,748,161 | * 5/1998 | Lebby et al. | 257/88 |
| 5,757,026 | 5/1998 | Forrest et al. | 257/40 |
| 5,959,413 | * 9/1999 | Komarek et al. | 315/169.3 |
| 6,011,355 | * 1/2000 | Nagai | 315/169.4 |

* cited by examiner

*Primary Examiner*—Don Wong
*Assistant Examiner*—Thuy Vinh Tran
(74) *Attorney, Agent, or Firm*—Morgan, Lewis & Bockius LLP

(57) ABSTRACT

A blue light emitting element B and green light emitting element G are coupled in series with each other to constitute a ring. The coupling points of these elements are used as a first connecting point 24 and a second connecting point 26. The one electrode of a red light emitting element R is connected to the first input terminal 24 and the other electrode thereof is used as a third terminal. By adjusting the voltages to be applied to the input terminals 24, 26 and 28, the light emitting state of each light emitting element is adjusted. Therefore, it is only required that wiring is made for these three input terminals. With the input state of the input terminal 24 being fixed, only the input states of the input terminals 26 and 28 are changed using switches SW1 and SW2 so that the light emitting state of each light emitting element can be adjusted. Thus, the device structure inclusive of its wiring can be further simplified, thereby realizing high density display of the light emitting device.

18 Claims, 17 Drawing Sheets

| SW1 | | | SW2 | |
|---|---|---|---|---|
| +V | -V | OFF | ON | OFF |
| B"ON" | G"ON" | BG"OFF" | R"ON" | R "OFF" |

| SW1 | | | SW2 | |
|---|---|---|---|---|
| +V | -V | OFF | ON | OFF |
| B"ON" | G"ON" | BG"OFF" | R"ON" | R "OFF" |

| SW1 | | | SW2 | |
|---|---|---|---|---|
| +V | -V | OFF | ON | OFF |
| B"ON" | G"ON" | BG"OFF" | R"ON" | R "OFF" |

| SW1 | | | SW2 | |
|---|---|---|---|---|
| +V | -V | OFF | ON | OFF |
| G"ON" | B"ON" | BG"OFF" | R"ON" | R "OFF" |

| SW1 | | | SW2 | |
|---|---|---|---|---|
| +V | -V | OFF | ON | OFF |
| G"ON" | B"ON" | BG"OFF" | R"ON" | R "OFF" |

LIGHT EMITTING APPLIANCE

BACKGROUND OF THE INVENTION

1. Field of the Invention

The present invention relates to a light emitting appliance, and more particularly to a light emitting appliance having unit light emitting devices each with at least three light emitting elements with substantially different emitting colors.

2. Description of the Related Art

As an example of an image display, a full-color image display using an organic EL (electroluminescence) has been proposed. FIG. 16A schematically shows the configuration of a display panel DP used in such a full color image display.

The display panel DP is provided with a glass substrate GL. On the glass substrate, a large number of anodes ANO's are arranged in stripes. On the anodes ANO's, a red light emitting layer R, a green light emitting layer G and a blue light emitting layer B are cyclically arranged in stripes in this order in stripes in a direction orthogonal to the anodes ANO's. Cathodes CR, CG and CB are arranged on and along the red light emitting layer R, green light emitting layer G and blue light emitting layer B, respectively.

A set of red light emitting layer R, green light emitting layer G and blue light emitting layer, which are sandwiched between a single anode ANO and a set of cathodes CR, CG and CB, constitute a unit light emitting device UL. Namely, the display panel DP is composed of a larger number of unit light emitting devices UL's arranged in a matrix form.

By adjusting the luminance of the red light emitting layer R, green light emitting layer G, blue light emitting layer B, the unit light emitting device UL can be caused to emit light at any color. By causing a large number of the unit light emitting devices UL's arranged in a matrix form to emit light, a full color image with any desired full color image can be displayed.

However, the above conventional full color image display using the organic EL presents the following problem. FIG. 16B is an equivalent circuit diagram of the unit light emitting device UL constituting the display panel DP shown in FIG. 16A. As seen from FIG. 16B, in order to cause the unit light emitting device UL to emit light at any color in the display panel DP, four terminals (one anode ANO and a set of cathodes CR, CG and CB) are required.

This makes the appliance structure inclusive of its wiring complicate, thus making it difficult to realize the display at a high density. Particularly, where a large number of display panels DP's shown in FIG. 16A are used in order to constitute a full color image display having a large number of pixels, the structure inclusive of the wiring becomes more complicate, thus making it further difficult to realize the display at a high density.

Further, in the display panel DP, three light emitting layers arranged at intervals on a plane, i.e. a red light emitting layer R, green light emitting layer G and blue light emitting layer B constitute a unit light emitting device UL. Therefore, there was a limitation to realize the high density of the display.

Further, generally, the luminance of each of the red light emitting layer R, green light emitting layer G and blue light emitting layer B are not equal on the same condition. In order to approximate the luminance of each light emitting layer to one another, the light emitting are, i.e. width of each light emitting layer, is made different. If the luminance of the red light emitting layer 1 is the lowest, that of the blue light emitting layer 2 is intermediate and that of the green light emitting layer 3 is the highest, as seen in FIG. 17, the width of the red light emitting layer 1 is made the largest W1, that of the blue light emitting layer 2 is made intermediate W2, and that of the green light emitting layer 3 is made the smallest W3. However, in such a technique, the green light emitting layer 3 having the smallest width W3 is a bottleneck in fabrication, and the presence of the red light emitting layer 1 further accelerates the difficulty of the display at a high density.

SUMMARY OF THE INVENTION

An object of the present invention is to solve the above problems to provide a light emitting appliance which can be realize the display at a high density.

In order to attain the above objects, the present invention is realized in various aspects defined in claims.

In accordance with a first aspect of the present invention, there is provided a light emitting appliance comprising unit light emitting devices each composed of at least three light emitting elements which are caused to emit light by application of a voltage between their anode and cathode and have substantially different emitted light colors, wherein a first light emitting element and a second light emitting element are coupled in series with each other to constitute a ring and coupling points of these elements are used to a first connecting point and a second connecting point, and the one electrode of a third light emitting element is connected to the first input terminal and the other electrode thereof is used as a third input terminal.

In this configuration, an input voltage to be applied to each of the first to third input terminals is adjustable so that a light emitting state of each of the first to third light emitting elements is adjusted. It is only required that the three input terminals are wired so that the wiring structure can be simplified, thereby realizing a high density display.

In the second to sixth aspects of the present invention, the first input terminal is grounded; the second input terminal is connected so as to be selectable from three connecting states of being connected to a positive potential, a negative potential and neither potential; and third input terminal is connected so as to be selectable from two connecting states of being connected to the positive or negative potential and neither potential.

In this configuration, the light emitting states of the three light emitting elements can be adjusted in a simple manner that the input state of the first input terminal is fixed and only the input states of the second input terminal and third input terminal are altered. This further simplifies the structure of the appliance inclusive of its wiring, thereby realizing the higher density display.

In the seventh aspect of the light emitting appliance according to the present invention, the three kinds of light emitting elements are stacked as three layers, and adjacent electrodes in a direction of stacking the light emitting elements are commonized(formed in common).

In such a configuration, since the three kinds of light emitting elements are stacked in three layers, the projected area of a unit light emitting device can be made approximately equal to that of a single light emitting element. Therefore, the projected area of the unit light emitting device can be reduced while the area of each of the light emitting elements is assured. This realizes a higher density display.

Since the adjacent electrodes are commonized in a direction of stacking the light emitting elements, the number of the electrodes can be reduced, the appliance structure inclusive of its wiring can be further simplified.

In an eighth aspect of the light emitting appliance according to the present invention, each of the three kinds of light emitting elements is a light emitting element having a light emitting layer sandwiched between its anode and cathode; and the first electrode serving as the first input terminal, light emitting layer of the first light emitting element, second electrode serving as the second input terminal, light emitting layer of the second light emitting element, intermediate electrode formed to be connected to the first electrode, light emitting layer of the third light emitting element, third electrode serving as the third input terminal are stacked in this order.

Therefore, with the three light emitting elements each having a light emitting layer between the anode and cathode, the electrodes and the light emitting layers have only to be alternately stacked, thereby a high density display can be realized.

In an ninth aspect of the display device according to the present invention, the first light emitting element serves as an light emitting element for emitting blue light; the second light emitting element serves as an light emitting element for emitting green light; the third light emitting element serves as a light emitting element for emitting red light; the first electrode, second electrode and intermediate electrode are made light-transmissive so that light is taken out from the side of the first electrode.

Therefore, by adjusting the light emitting state of each of these three kinds of light emitting elements, light at any color can be obtained.

The light emitted from each of the light emitting elements is taken out without passing through the light emitting layer providing a longer wavelength than its own wavelength. Therefore, the light having a short wavelength will not be absorbed by the light emitting layer providing a longer wavelength. Thus, the light from each of the light emitting layers can be effectively taken out.

In the tenth aspect of the display appliance according to the present invention, the first to third input terminals are wired (connected) so that they are taken out from the side of the third electrode.

In this configuration, since those input terminals are wired on the third electrode opposite to the side where light is taken out, the material of wiring can be selected without being subjected to the limitation of light transmittance. Namely the material is not required to be transparent. For example, the wiring is made using the material having low electric resistance so that light can be effectively emitted.

In an eleventh aspect of the light emitting appliance according to the present invention, in a light emitting appliance comprising unit light emitting devices each composed of at least three light emitting elements having substantially different emitted light colors, the first light emitting element and the second light emitting element are made selectively light-emittable at a predetermined time rate within a unit light emitting time, and the third light emitting element is made light-emittable all the time.

In this configuration, among the three light emitting elements, the light emitting element which is desired to emit light for the longest time is served as the third light emitting element, whereas the light emitting elements which are not desired to emit light for a longer time than in the third light emitting element are served as the first and the second light emitting element. Each of the light emitting elements can be caused to emit light in a good balance.

In the twelfth aspect of the light emitting appliance according to the present invention, the light emitting element having the largest electric power to acquire the same luminance among the three light emitting elements is used as the third light emitting element.

Therefore, the light emitting element requiring the largest electric power to acquire the same luminance among the three light emitting elements can be caused to emit light for a longest time. Therefore the light emitting element can be derived with a lower power for the all time. Thus, the average luminance for a prescribed time can be assured to a certain degree without increasing the current density of the pertinent light emitting element so greatly. Namely, the power consumption of the pertinent light emitting element can be decreased while assuring the average luminance for a prescribed time to a certain degree.

In the thirteenth aspect of the light emitting device according to the present invention, the light emitting element requiring the second larger electric power to acquire the same luminance among the three light emitting elements is used as the first light emitting element; and the time rate during which the first light emitting element is light-emittable within a unit light emitting time is longer than that during which the second light emitting element is light-emittable.

Therefore, the light emitting element requiring the second larger power to acquire the same luminance can be caused to emit light for a second longer time. Thus, the average luminance for a prescribed time can be assured to a certain degree without increasing the current density of the pertinent light emitting element so greatly. Namely, the power consumption of the pertinent light emitting element can be decreased while assuring the average luminance for a prescribed time to a certain degree.

In the fourteenth aspect of the light emitting appliance according to the present invention, the time rate is defined so that the average luminance of the first light emitting element within a unit light emitting time is substantially equal to that of the second light emitting element.

Therefore, the average luminance for a prescribed time of each light emitting element can be made uniform.

In the fifteenth aspect of the present invention, the first light emitting element serves as a light emitting element for emitting blue light; the second light emitting element serves as a light emitting element for emitting green light; and the third light emitting element serves as a light emitting element for emitting red light.

Therefore, by adjusting the light emitting state of each of the three light emitting elements, the light at any optional color can be acquired.

Therefore, the light emitting element requiring the largest power to acquire the same luminance can be caused to emit light for a longest time, and the light emitting element requiring the second larger power to acquire the same luminance can be caused to emit light for a second longer time. Thus, the average luminance for a prescribed time can be assured to a certain degree without increasing the current density of each of the pertinent light emitting elements so greatly. Namely, the power consumption of the pertinent light emitting elements can be decreased while assuring the average luminance for a prescribed time to a certain degree.

In the sixteenth aspect of the light emitting appliance according to the present invention, the three kinds of light emitting elements are plane light emitting elements each equipped with a light emitting layer of an organic material.

Therefore, the light emitting layer having a very thin film can be realized. This permits the planar size of the light emitting layer to be reduced greatly, and hence realizes a higher density display.

In the seventeenth aspect of the light emitting appliance according to the present invention, an input voltage to be applied to each of the first to third input terminals is adjustable so that a light emitting state of each of the first to third light emitting elements is adjusted.

In this configuration, a potential of each of the first to third input terminals is adjustable to be an optimum light emitting state. Thereby many kind of colour light can be obtained by only determining a potential balance between each colour.

Further, the pertinent light emitting layer can be caused to emit light at a low DC current. This contributes to realization of a small-sized inexpensive light emitting appliance. The above and other objects and features of the present invention will be more apparent from the following description taken in conjunction with the accompanying drawings.

DESCRIPTION OF THE PREFERRED EMBODIMENTS

Figures 1A, 1B:
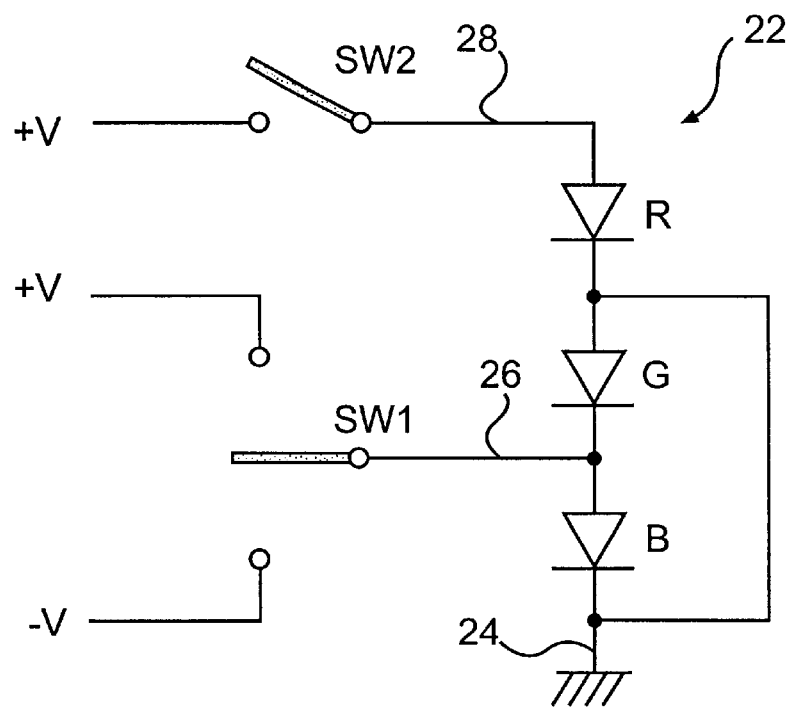
FIGS. 1A and 1B are an equivalent circuit diagram of a unit light emitting device 22 constituting a full-color display which is a light emitting appliance according to a first embodiment of the present invention, and a table showing the relationship between the status of each of switches SW1 and SW2 and that of each of the light emitting elements.

Now referring to the drawings, an explanation will be give of the light emitting device according to several embodiments of the invention.

Embodiment 1

FIGS. 1A is an equivalent circuit diagram of a unit light emitting device 22 constituting a full-color display which is a light emitting device according to a first embodiment of the present invention. The unit light emitting device 22 includes a blue light emitting element B (first light emitting element) which emits blue light, a green light emitting element G (second light emitting element) which emits green light and a red light emitting element R (third light emitting element) which emits red light.

Each of the blue light emitting element B, green light emitting element G and red light emitting element R is a plane light emitting element (organic EL light emitting element) with a light emitting layer of organic material sandwiched between an anode and cathode. These light emitting elements are caused to emit light by applying a voltage between the anode and cathode.

The light emitting layer, which is made of the organic material, can have a very small thickness. This greatly reduces the planer size of the light emitting layer, thus realizing the high density display. In addition, the light emitting layer, which is made of the organic material, can be caused to emit light by a low DC current conveniently.

As seen from FIG. 1A, the blue light emitting element B and green light emitting element G are coupled in series with each other to constitute a ring. A coupling point between the cathode of the blue light emitting element B and the anode of the green light emitting element G is used as a first input terminal 24 which is grounded. Another coupling point between the anode of the blue light emitting element B and the cathode of the green light emitting element G is used as a second input terminal 26 which is connected to the one end of the switch SW1 of the input terminal 26.

The cathode of the red light emitting element R is connected to the first input terminal 24. The anode of the red light emitting element R is used as a third input terminal 28 which is connected to the one of the switch SW2.

The other end of the switch SW1 can be placed in one selected from three states where it is connected to a positive potential (+V), to a negative potential (−V), and not connected to either potential (OFF). The other end of the switch SW2 can be placed in one selected from two states where it is connected to a positive potential (+V) and not connected to the positive electrode (OFF).

FIG. 1B is a table showing the relationship between the status of each of switches SW1 and SW2 and that of each of the light emitting elements. When the other end of the switch SW1 is connected to the positive potential (+V), the blue light emitting element B turns on (or lights), whereas the green light emitting element G turns off (or does not light). When the other end of the switch SW1 is connected to the negative potential (−V), the blue light emitting element B turns off (or does not light), whereas the green light emitting element G turns on (or lights). When the switch SW1 is placed in the OFF state, both of green light emitting element B and green light emitting element G turn off (or do not light).

When the switch SW2 is placed on the ON state, the red light emitting element R turns on (or lights). When the switch SW2 is placed on the OFF state, the red light emitting element R turns off (or does not light). Incidentally, it should be noted that the switches SW1 and SW2 can be controlled independently of each other.

In this way, the switching between the switches SW1 and SW2 in a suitable manner permits each of the light emitting elements to be on/off controlled. By controlling the lighting (or "on") time of each light emitting element in a prescribed unit light emitting time, light at a desired color can be obtained within the unit light emitting time.

Embodiment 2

Figures 2A, 2B:
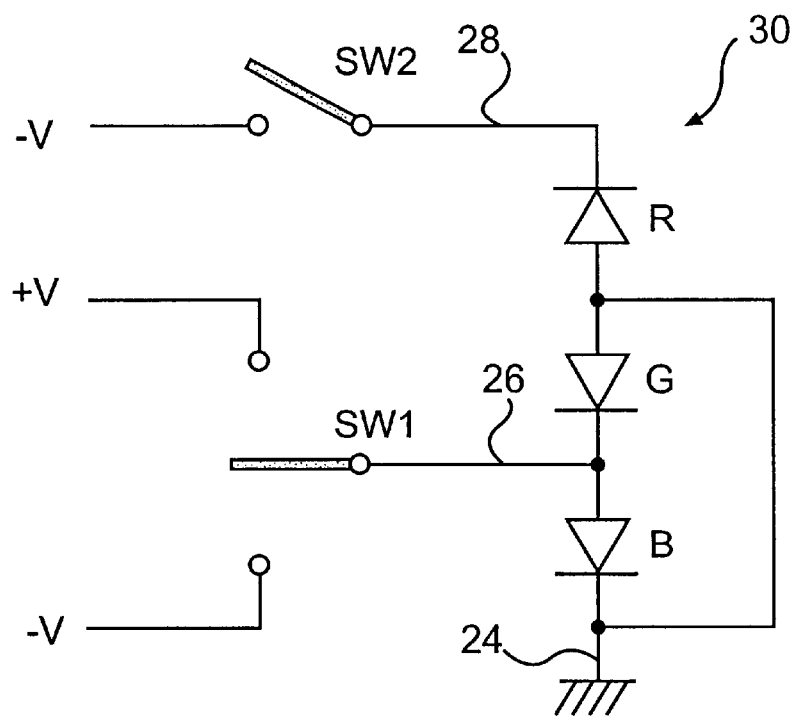
FIGS. 2A and 2B are an equivalent circuit diagram of a unit light emitting device 30 constituting a full-color display which is a light emitting appliance according to a second embodiment of the present invention, and a table showing the relationship between the status of each of switches SW1 and SW2 and that of each of the light emitting elements.

FIGS. 2A is an equivalent circuit diagram of a unit light emitting device 30 constituting a full-color display which is a light emitting device according to a second embodiment of the present invention. The unit light emitting device 30 has a structure similar to that of the unit light emitting device 22 (see FIG. 1A).

However, the unit light emitting device 30 is different from the unit light emitting device 24 in that the anode of the red light emitting element R is connected to the first input terminal 24 and the cathode of the red light emitting element R is used as the third input terminal 28.

Further, the unit light emitting device 30 is different from the unit light emitting device 22 in that the other end of the switch SW2 can be placed in one selected from two states where it is connected to a negative potential (−V) and not connected to the negative electrode (OFF).

FIG. 2B is a table showing the relationship between the status of each of switches SW1 and SW2 and that of each of the light emitting elements. This relationship in the unit light emitting device 30 is the same as that in the unit light emitting device 22.

Embodiment 3

Figures 3A, 3B:
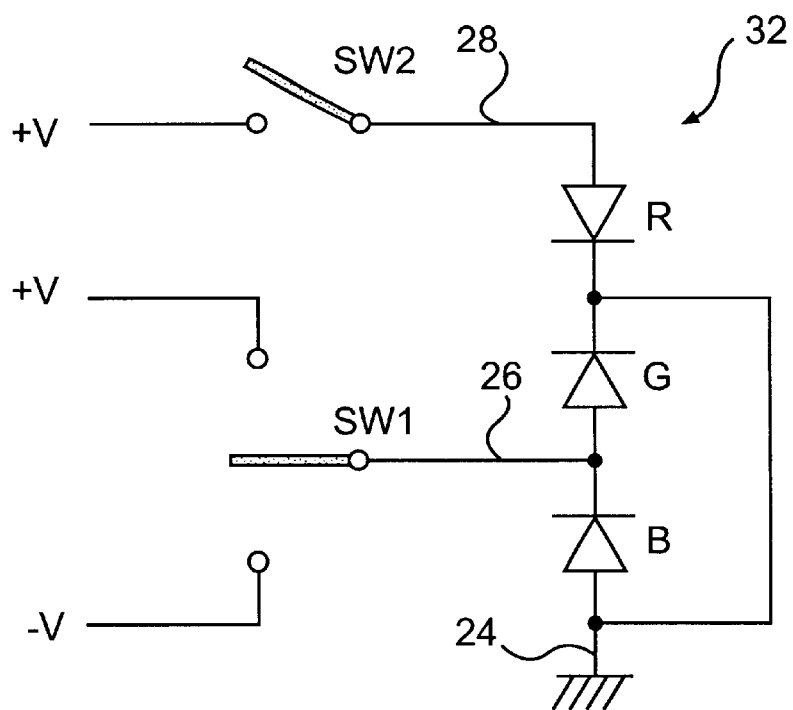
FIGS. 3A and 3B are an equivalent circuit diagram of a unit light emitting device 32 constituting a full-color display which is a light emitting appliance according to a third embodiment of the present invention, and a table showing the relationship between the status of each of switches SW1 and SW2 and that of each of the light emitting elements.

FIG. 3A is an equivalent circuit diagram of a unit light emitting device 32 constituting a full-color display which is a light emitting device according to a third embodiment of the present invention. The unit light emitting device 32 has a structure similar to that of the unit light emitting device 22 (see FIG. 1A).

However, the unit light emitting device 32 is different from the unit light emitting device 22 in the following points. In the unit light emitting device 32, a coupling point between the anode of the blue light emitting element B and the cathode of the green light emitting element G is used as the first input terminal 24 which is grounded. Another coupling point between the cathode of the blue light emitting element B and anode of the green light emitting element G is used as the second input terminal 26 which is connected to the one of the switch 1.

FIG. 3B is a table showing the relationship between the status of each of switches SW1 and SW2 and that of each of the light emitting elements. This relationship in the unit light emitting device 32 is similar to that in the unit light emitting device 22.

The above relationship in the unit light emitting device 32 is different from that in the unit light emitting device 22. In the unit light emitting device 32, when the other end of the switch SW1 is connected to the positive potential (+V), the blue light emitting element B turns off, whereas the green light emitting element G turns on. When the other end of the switch SW1 is connected to the negative potential (−V), the blue light emitting element B turns on, whereas the green light emitting element G turns off.

Embodiment 4

Figures 4A, 4B:
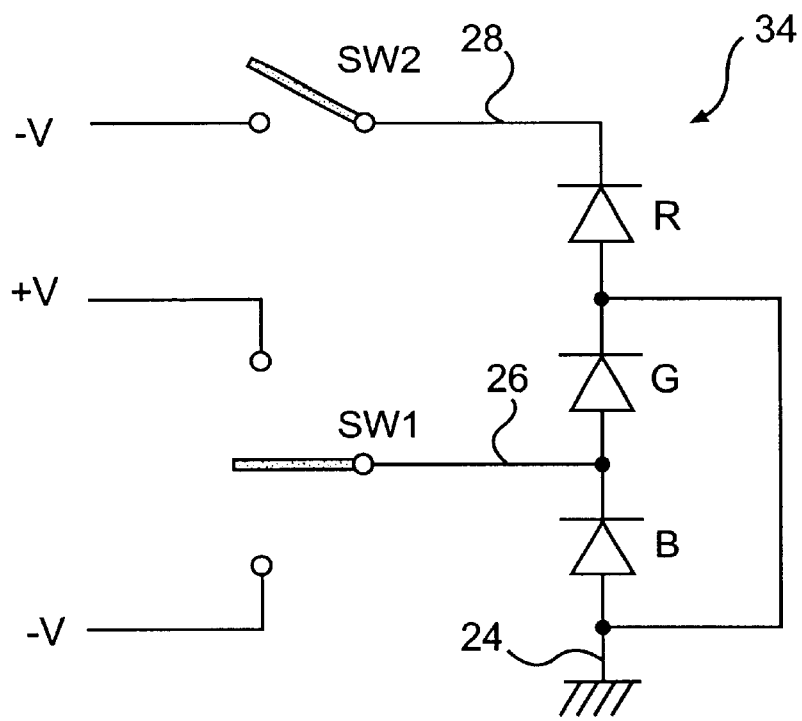
FIGS. 4A and 4B are an equivalent circuit diagram of a unit light emitting device 32 constituting a full-color display which is a light emitting appliance according to a fourth embodiment of the present invention, and a table showing the relationship between the status of each of switches SW1 and SW2 and that of each of the light emitting elements.

FIG. 4A is an equivalent circuit diagram of a unit light emitting device 34 constituting a full-color display which is a light emitting device according to a fourth embodiment of the present invention. The unit light emitting device 32 has a structure similar to that of the unit light emitting device 32 (see FIG. 3A).

However, the unit light emitting device 34 is different from the unit light emitting device 32 in that the anode of the red light emitting element R is connected to the first input terminal and the cathode of the red light emitting element is used as the third input terminal 28.

Further, the unit light emitting device 34 is different from the unit light emitting device 32 in that the other end of the switch SW2 can be placed in one selected from two states where it is connected to a negative potential (−V) and not connected to the negative electrode (OFF).

FIG. 4B is a table showing the relationship between the status of each of switches SW1 and SW2 and that of each of the light emitting elements. This relationship in the unit light emitting device 34 is the same as that in the unit light emitting device 32.

In the respective embodiments of the present invention described above, the blue light emitting element B and green light emitting element G are coupled in series with each other to constitute a ring. The coupling points are used as the first input terminal 24 and second input terminal 26. The one electrode of the red light emitting element R is connected to the first input terminal, whereas the other electrode thereof is used as the third input terminal 28. In such a circuit configuration, by adjusting the voltages applied to the respective input terminals 24, 26 and 28, the light emitting state of each of the light emitting elements can be adjusted.

Thus, wiring has only to be made for only the three input terminals 24, 26 and 28. Therefore, the structure inclusive of the wiring can simplified so as to realize the height density display.

Further, the first input terminal 24 is grounded. The connecting state of the second input terminal 26 is placed in one selected from three states where it is connected to a positive potential (+V), to a negative potential (−V), and connected to neither potential (OFF). The connecting state of the third input terminal is placed in one selected from two states where it is connected to either of the positive potential (+V) and negative potential (−V) and not connected to the positive electrode (OFF).

Therefore, by only changing the input state of each of the second input terminal 26 and third input terminal 28 as well as changing the input state of the first input terminal 24, the light emitting state of each of the light emitting elements can be adjusted. Therefore, the structure inclusive of the wiring can simplified so as to realize the higher density display.

Figure 5:
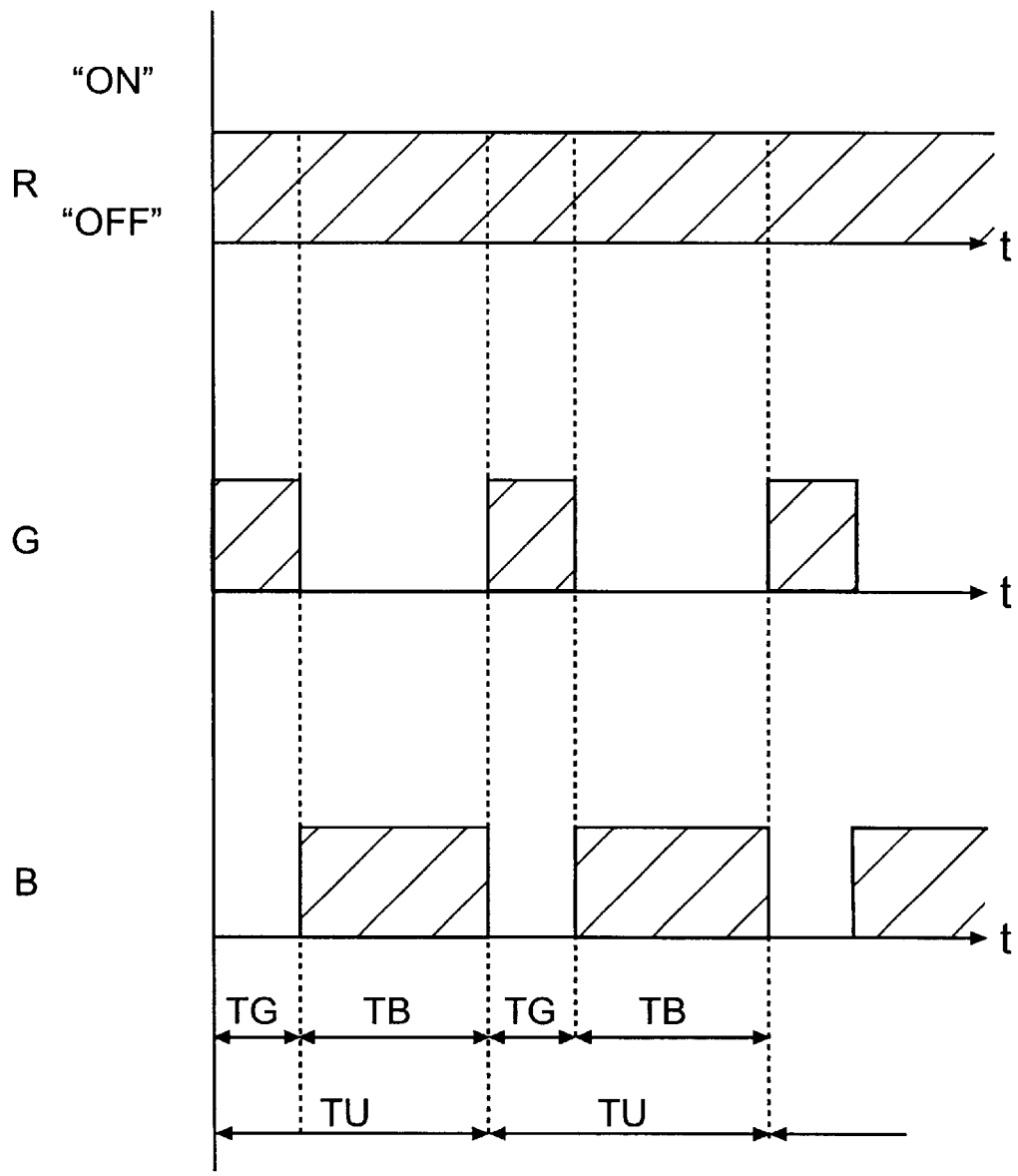
FIG. 5 is a timing chart of the ON/OFF state of each of the light emitting elements pf the unit light emitting device 34 when they are lit fully, respectively.

FIG. 5 is a timing chart when any of the unit light emitting devices described above, for example, the respective light emitting elements of the unit light emitting device 34 shown in FIG. 4, i.e. blue light emitting element B, green light emitting element G and red light emitting element R are lit (or turned on) fully.

In the example shown in FIG. 5, the blue light emitting element B and green light emitting element G are configured to be selectively light-emittable at a prescribed time rate (TB:TG) within a unit light emitting time TU. The red light emitting element R is configured to be light-emittable during each entire unit time TU because it required the largest electric power to provide the same luminance for the respective light emitting elements as described later.

The time interval TB during which the blue light emitting element B is light-emittable is made longer than the time interval TG during which the green light emitting element G is light-emittable. This is because the blue light emitting element B requires the second larger electric power to provide the same luminance for the respective light emitting elements as described later.

Figure 7A:
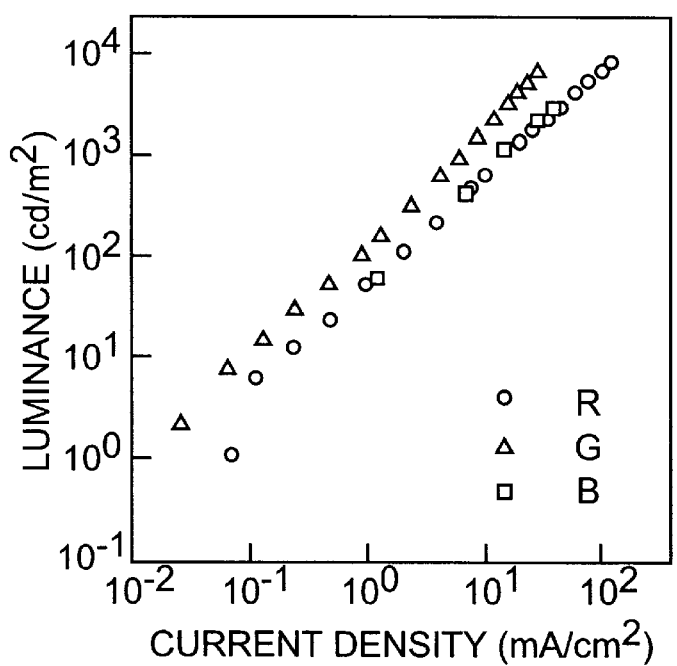
FIGS. 7A and 7B are a graph showing the relationship between a current density and luminance, and a graph showing the relationship between a bias voltage and a luminance.
Figure 7B:
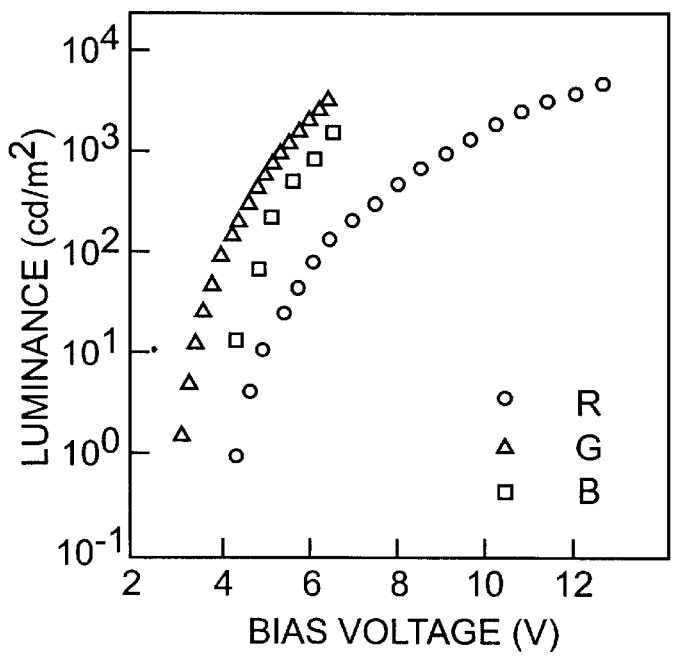

FIG. 7A is a graph showing the relationship between the current density and luminance for each light emitting element. FIG. 7B is a graph showing the relationship between the bias voltage and luminance for each light emitting element. As seen from FIG. 7A, the current density required to acquire the same luminance is larger for the red light emitting element and blue light emitting element B and smaller for the green light emitting element G. Further, the bias voltage required to acquire the same luminance is largest for the red light emitting element R, intermediate for the blue light emitting element and smallest for the green light emitting element G.

Thus, it can be understood from FIGS. 7A and 7B that the electric power required to acquire the same luminance for the respective light emitting elements is largest for the red light emitting element R, intermediate for the blue light emitting element B and smallest for the green light emitting element G.

In this way, by making the red light emitting element R, which requires the largest electric power to provide the same luminance, lightable or light-emittable for the longest period, the average luminance within a prescribed time can be assured to a certain degree without increasing the current density of the red light emitting element R so greatly. Namely, the electric power consumed for the red light emitting element R can be reduced while the average luminance within the prescribed time is assured to a certain degree. Further, by making the blue light emitting element B, which requires the intermediate electric power to provide the same luminance, lightable or light-emittable for the intermediate period, the average luminance within a prescribed time can be assured to a certain degree without increasing the current density of the blue light emitting element B so greatly. Namely, the electric power consumed for the blue light emitting element B can be reduced while the average luminance within the prescribed time is assured to a certain degree.

Further, in this example, the time rate (TB:TG) is determined so that within the unit light emitting time TU, the average luminance of the blue light emitting element B and that of the green light emitting element G are substantially equal to each other. For this reason, the average luminance of each light emitting element within the prescribed time can be uniformed to a certain degree.

Figure 6:
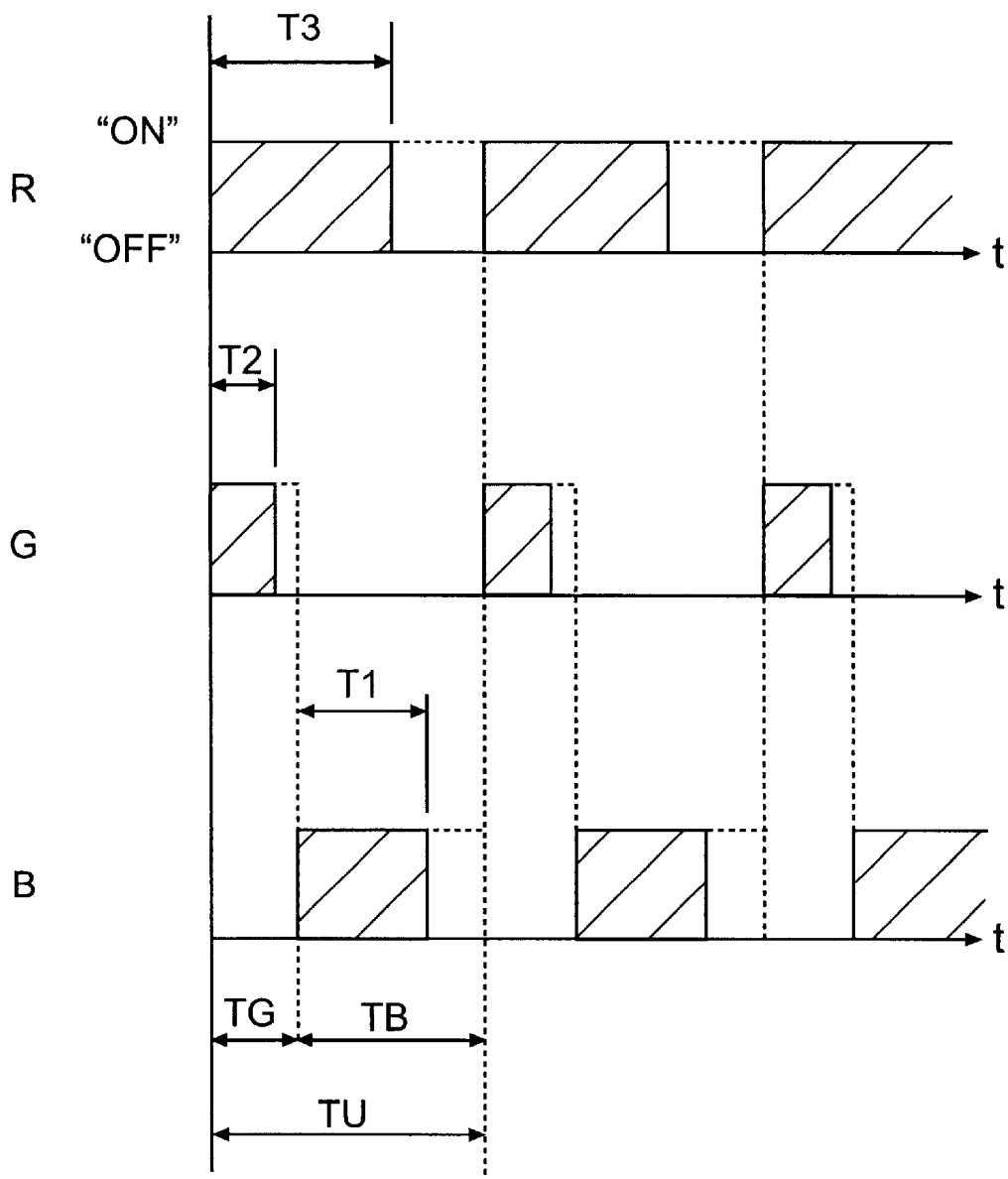
FIG. 6 is a timing chart of the ON/OFF state of each of the light emitting elements pf the unit light emitting device 34 when any optional color is obtained from the unit light emitting device 34.

FIG. 6 is a timing chart of the lighting or light emitting state of each of the light emitting elements, i.e. blue light emitting element B, green light emitting element B and red light emitting element R when any color is obtained from the unit light emitting device 34 in the case where the light-emittable time rate for the respective light emitting elements in the unit light emitting time TU is determined as shown in FIG. 5. By adjusting the light emitting state of each of the light emitting elements which emit light of blue, green and red which are primary colors of light, the light at any optional color can be acquired.

Specifically, as seen from FIG. 6, by adjusting the lighting times T1, T2 and T3 of the blue light emitting element B, green light emitting element G and red light emitting element R within the periods 0-TB, 0-TG and 0-TU, respectively, the light at any optional color can be obtained.

Figure 8:
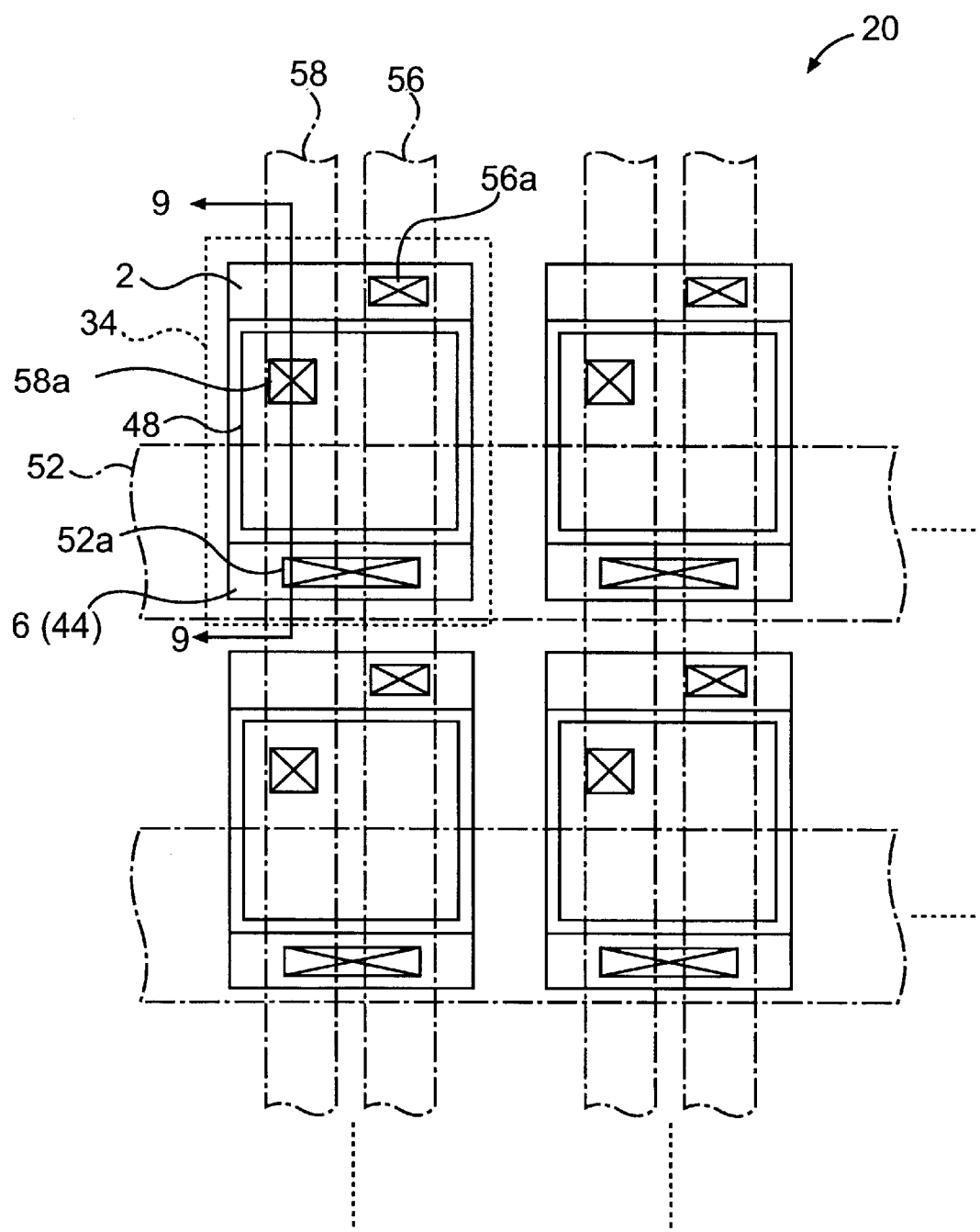
FIG. 8 is a schematic plan view of a display panel 20 on which unit light emitting devices 34 are arranged in a matrix form.
Figure 9:
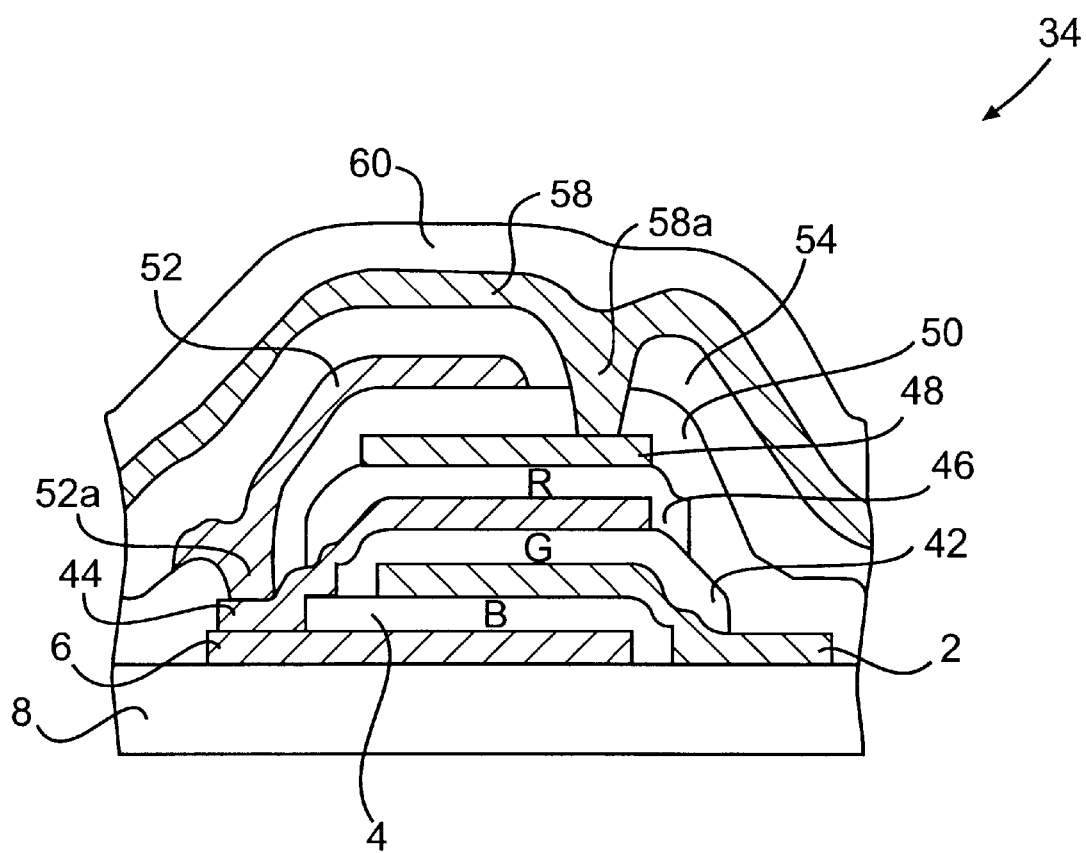
FIG. 9 is a sectional view taken in line 9—9.
Figure 10A:
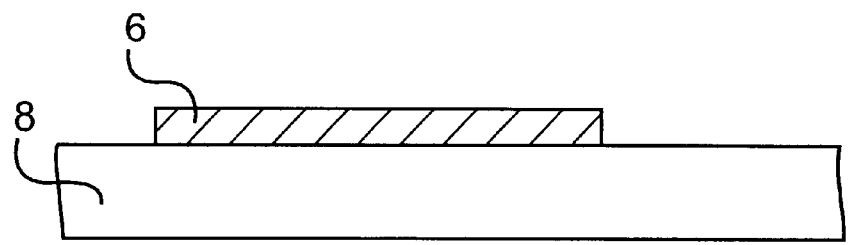
FIGS. 10A–10C are schematic sectional views for explaining the process for manufacturing the display panel 20 equipped with the unit light emitting devices 34.
Figure 10B:
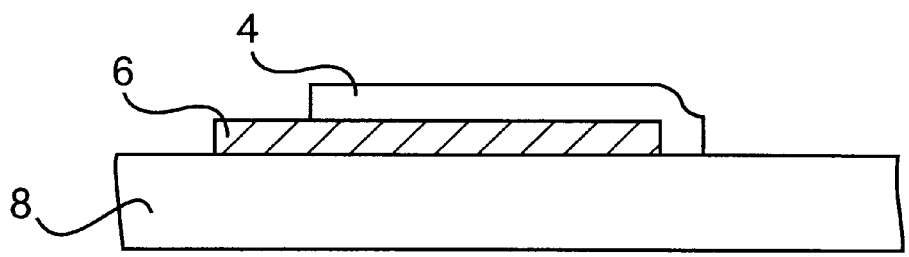
Figure 10C:
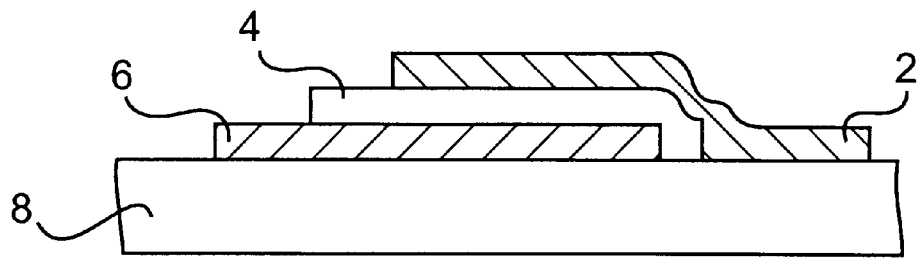

FIG. 8 is a schematic plan view of the display panel 20 on which any of the light emitting devices described above, e.g. a plurality of the unit light emitting devices 34 are arranged in a matrix form with rows and columns. FIG. 9 is a sectional view taken in line 9—9. The full color display serving as a light emitting appliance can be constructed by using one or more display panels. 20. As seen from FIG. 9, the unit light emitting device 34 constituting the display panel includes three stacked layers of the respective light emitting elements described above. In the direction of stacking the respective light emitting elements, adjacent electrodes are commonly used or commonized.

Specifically, the unit light emitting device 34 includes, on a glass substrate 8, a first electrode 6, blue light emitting layer 4, second electrode 2, green light emitting layer 42, an intermediate electrode 44, intermediate electrode 44, red light emitting layer 46 and a third electrode 48 in this order.

The first electrode 6 corresponds to the first input terminal 24 (see FIG. 4A). The blue light emitting layer 4 is a light emitting layer of the blue emitting element B (FIG. 4A). The second electrode 2 corresponds to the second input terminal 26 (FIG. 4A). The green light emitting layer 42 is the light emitting layer of the green light emitting element G (FIG. 4A). The intermediate electrode 44 is connected to the first electrode 6. The red light emitting layer 46 is the light emitting layer of the red light emitting element (FIG. 4A). The third electrode 48 corresponds to the third input terminal 28 (FIG. 4A).

By stacking the blue light emitting element B, green light emitting element G and red light emitting element R in three layers, the projected area of the unit light emitting device 43 can be approximated to that of the single light emitting element. This permits the projected area of the unit light emitting device to be reduce while the area of each light emitting element is ensured, thereby realizing the high density display.

In FIG. 9, an electrode 2 commonizes the cathode of the blue light emitting element B (FIG. 4A) and the anode of the green light emitting element G (FIG. 4A). An intermediate electrode 44 commonizes the cathode of the green light emitting element G (FIG. 4A) and the anode of the red light emitting element R (FIG. 4A).

In this way, by commonizing the adjacent electrodes in a direction of stacking the light emitting elements, the number of electrodes can be reduced so as to simplify the structure inclusive of the wiring. Since it is not required for an insulating layer to be provided between the adjacent light emitting elements, the structure of the light emitting device can be simplified. Especially a wiring length can be decreased.

The green light emitting element B, green light emitting element G and red light emitting element R are stacked in this order, and the electrodes 6 and 2 and intermediate electrode 44 are made light-transmittable. In this structure, light is taken out from the side of the electrode 6 through the electrode 6.

The light emitted from the blue light emitting element B, green light emitting element G and red light emitting element R can be taken out without passing the light emitting layer providing a longer wavelength than its own wavelength. Therefore, the light having a short wavelength will not be absorbed by the light emitting layer having a longer wavelength. Namely, the light emitted from each light light emitting layer can be effectively taken out.

As seen from FIGS. 8 and 9, wirings 52, 56 and 58 which are connected to the electrode 6 (intermediate 44), electrode 2 and electrode 48 are arranged on the opposite side to the glass substrate 8.

Thus, by arranging the wirings 52, 56 and 58 on the opposite side to the side of taking out the light, they can be made of the material having a low electric resistance, e.g. aluminum or its alloy without suffering from the limitation of light-transmissivity. This contribute to more efficient light-emission.

Referring to FIGS. 9–12, an explanation will be given of a method of manufacturing a display panel 20 equipped with the unit light emitting device 34 (FIG. 4A). First, as shown in FIG. 10A, the glass substrate 8 is prepared, and the electrode 6 having a prescribed shape is formed on the surface of the glass substrate 8. On the resultant surface, as shown in FIGS. 10B–10C, the blue light emitting layer 4 and electrode 2 each having a prescribed shape are formed in this order.

Figure 11A:
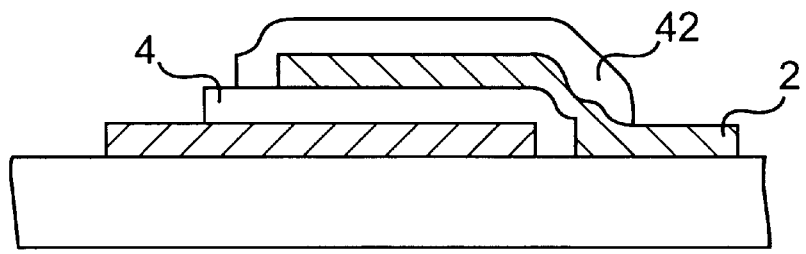
FIGS. 11A–11C are schematic sectional views for explaining the process for manufacturing the display panel 20 equipped with the unit light emitting devices 34.
Figure 11B:
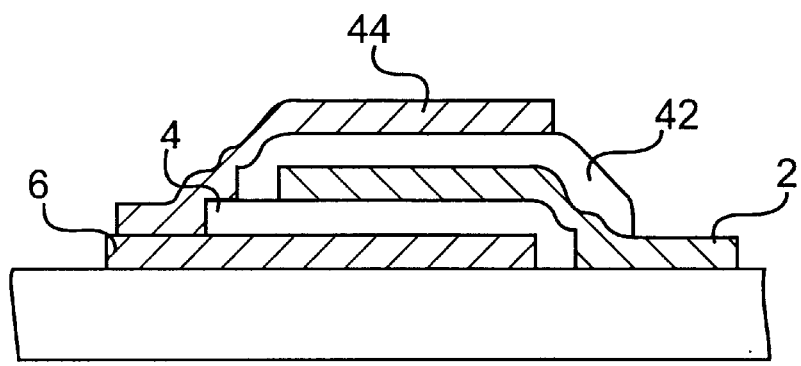
Figure 11C:
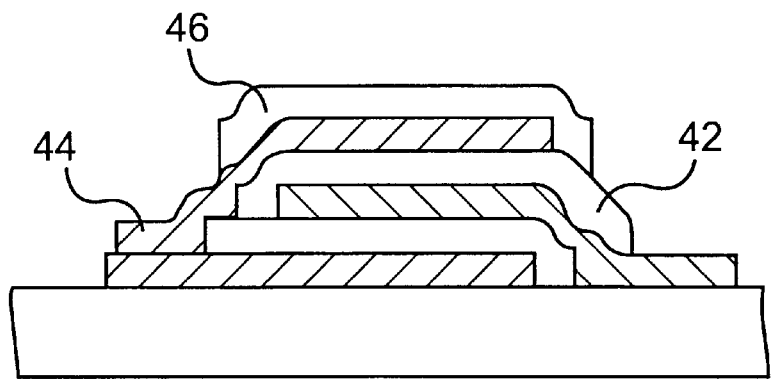
Figure 12A:
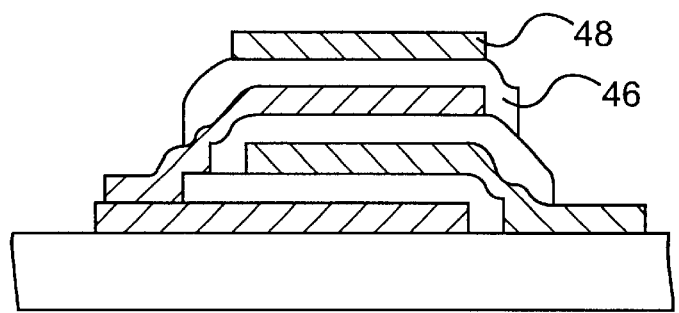
FIGS. 12A–12C are schematic sectional views for explaining the process for manufacturing the display panel 20 equipped with the unit light emitting devices 34.

On the resultant surface, as shown in FIGS. 11A–11C, the green light emitting layer 42, intermediate 44, red light emitting layer 46 each having a prescribed shape are formed in this order. Further, as shown in FIG. 12A, the electrode 48 having a prescribed shape is formed on the resultant surface.

Figure 12B:
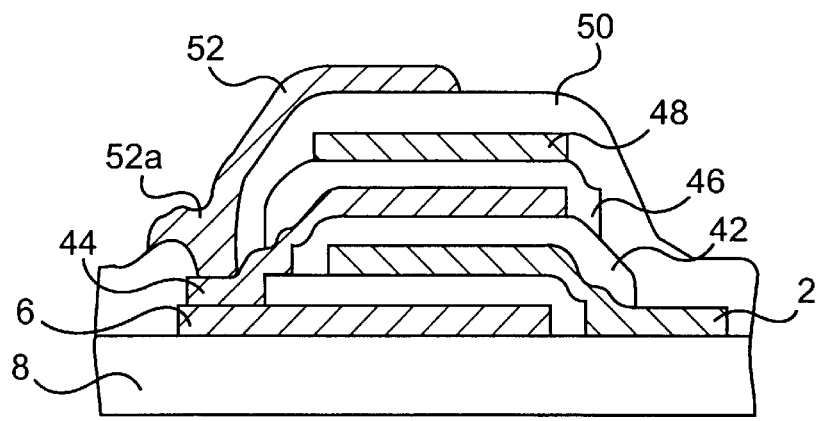

Further, as shown in FIG. 12B, the insulating film 50 is formed on the resultant surface. The wiring 52 is formed on the insulating film 50. The wiring 53 is connected to the intermediate electrode 44 at an contact portion 52a. As described above, the intermediate electrode 44 and the electrode 6 are connected to each other.

Figure 12C:
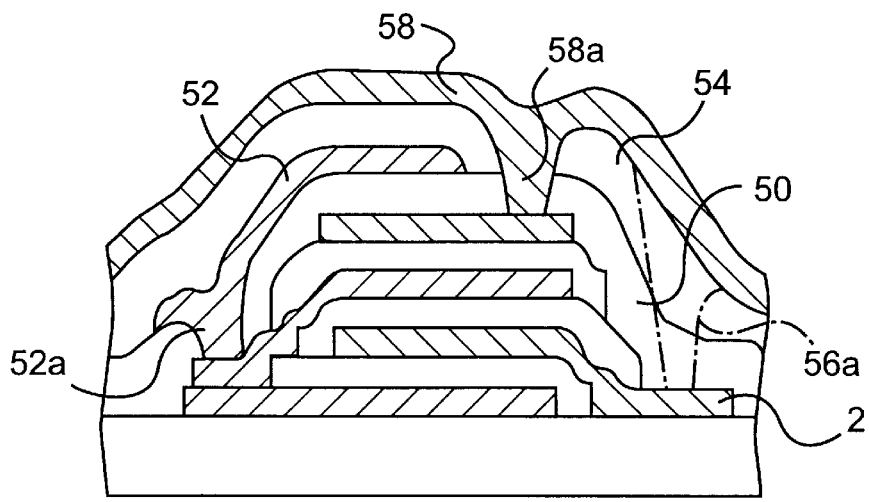

As shown in FIG. 12C, the insulating film 54 is formed on the resultant surface. The wiring 54 is formed on the insulating film 54. The wiring 58 is connected to the intermediate electrode 44 at a contact portion 58a. Simultaneously when the wiring 58 is formed, as shown in FIG. 8, the wiring 56 is formed on the insulating film 54. The wiring 56 is connected to the electrode 2 at a contact portion 56a (FIG. 12C).

Thereafter, as shown FIG. 9, the resultant surface is covered with the insulating film 60.

Although the material and making method of the electrode 6, electrode 2 and intermediate electrode 44 should not be particularly limited, they can be formed by the evaporation technique using an oxide transparent electrode material such as ITO, indium oxide and zinc oxide and a shadow mask. Particularly, the electrode 6, which is mainly used as anode, can be made of a metal having a work function such as Au from the standpoint of improving the injection property of holes.

The material of the electrode 48 should not be particularly limited. For example, since the electrode 48 is used as a cathode, from the point of view of improving electron injection, it may be made of the metal having a smaller work function, such as Mg family, Li family, Ca family, etc. A mixture of different kinds of metals, such as Mg:Ag, Mg:Al, Al:Li, etc. in which the metal having a small work function becomes hard to be oxidized is conveniently improved in stability. This is a reason why $Al_2O_3$ layer which is hard to be oxidized more, is formed on the surface of the metal. This $Al_2O_3$ layer is sufficient to be formed to a few atomic layer.

The method of manufacturing the electrode 48 should not be also limited. For example, it can be formed by evaporation using a shadow mask.

The material of the blue light emitting layer 4, green light emitting layer 42 and red light emitting layer 46 should not be limited. For example, it may be a light emitting material belonging to a low molecule family. Such a material includes a distyryllallylen (DSA) family such as Et-DSB, BCzVBi, DPVBi; oxadiazole family; pyrazoloquinoline family; benzaoxazole family such as Zn(BOX)2; alumichlete family such as BAlq1, etc. It may be also a polymeric light emitting material.

The method of manufacturing the blue light emitting layer 4, green light emitting layer 42 and red light emitting layer 46 should not be particularly limited. For example, it can be formed by evaporation using a shadow mask.

The material of and method of manufacturing the wirings 52, 56 and 58 should not be particularly limited. For example, it can be formed by sputtering using an aluminum or aluminum alloy.

The material of and method of manufacturing the insulating films 50, 54 and 60 should not be particularly limited. For example, it can be formed by CVD (chemical vapor deposition) using silicon oxide, silicon nitride, etc.

In the above embodiment, the layer structure of each light emitting element, for example, blue light emitting element B (FIG. 4A) has a structure in which the blue light emitting layer 4 is sandwiched between the electrodes 2 and 6. However, the layer structure of the blue light emitting element B should not be limited to such a structure. The layer structure of the blue light emitting element B may be shown in FIGS. 13A–13D. The structure shown in FIG. 13A is the layer structure in the above embodiment.

Figure 13D:
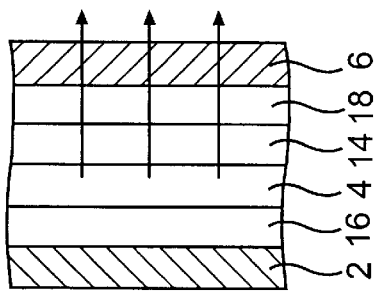
FIGS. 13A–13D are sectional views each showing the layer structure of a blue light emitting element B.
Figure 13C:
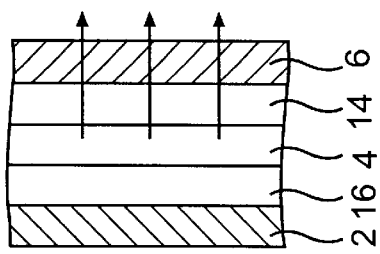
Figure 13B:
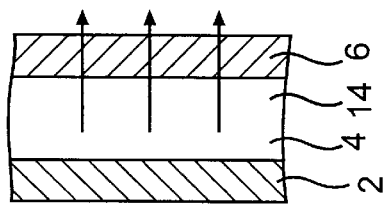
Figure 13A:
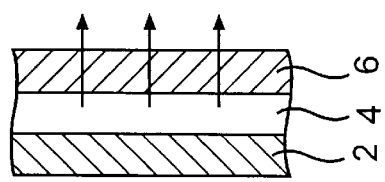

FIG. 13B shows a layer structure in which a hole transporting layer (HTL) 14 is further sandwiched between the blue light emitting layer 4 and electrode 6 in FIG. 13A.

The material of the hole transporting layer 14 should not be particularly limited. It may be preferably the material which provides high injection of holes into the blue light emitting layer 4 and does not give injection of electrons from the blue light emitting layer 4 into the hole transporting layer 14. For example, it may be an amine family material.

FIG. 13C shows a layer structure in which an electron transporting layer (ETL) 16 is further sandwiched between the electrode 2 and blue light emitting layer 4 shown in FIG. 13B.

The material of the electron transporting layer 16 should not be particularly limited. For example, it may be alumichlate family such as Alq, oxadiazole derivative, etc.

FIG. 13D shows a layer structure in which a hole injection layer 18 is further sandwiched between the hole transporting layer 14 and electrode 6 shown in FIG. 13C.

Figure 14:
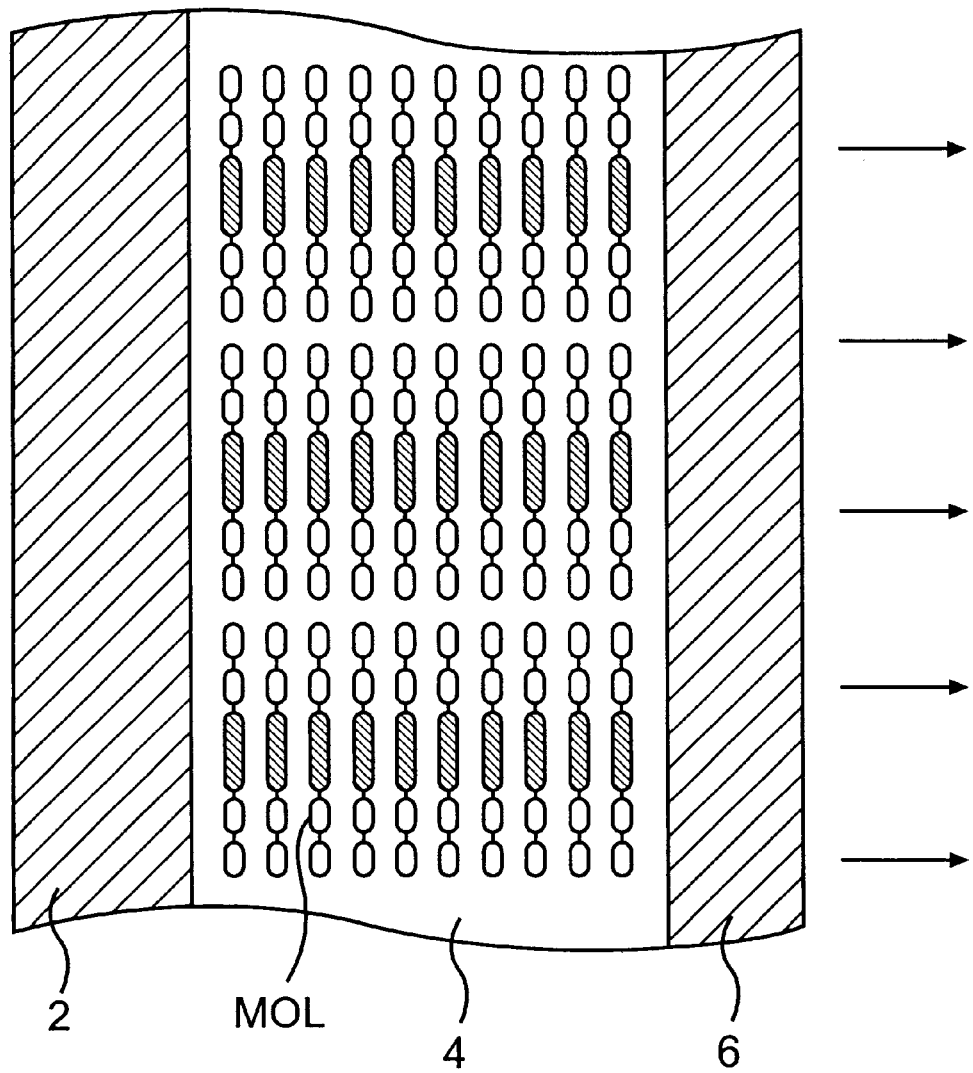
FIG. 14 is a sectional view showing a typical molecular arrangement in an organic material of the blue light emitting layer 4.

The material of the hole injection layer 18 should not be particularly limited. For example, it is preferably a material having hole injection barrier for the electrode 6. It may be an amine family or phthalocyanine family. FIG. 14 is a view showing the molecular orientation of an organic material in the blue light emitting layer 4. The molecular orientation of the organic material in the blue light emitting layer 4 should not be particularly limited. The structure as shown in FIG. 14, in which molecules constituting the organic material are oriented substantially in parallel to the electrodes 2 and 6, can conveniently realize a high light emitting intensity with a lower voltage.

Figure 15A:
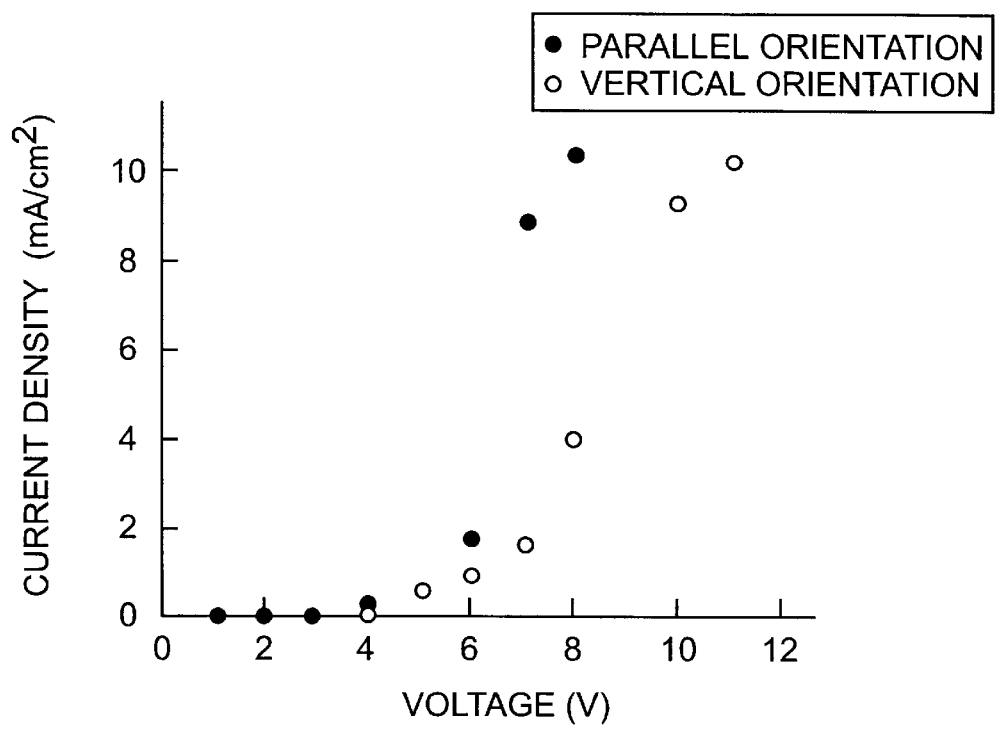
FIGS. 15A and 15B are a graph showing the relationship between a voltage applied between electrodes 2 and 6 and a current density flowing through the blue light emitting layer, and a graph showing the relationship between the voltage applied between the electrode 2 and 6 and a light emitting intensity of the blue light emitting layer 4.

FIG. 15A is a graph showing a relationship between a voltage applied between the electrodes 2 and 6 and the current density of a current flowing the blue light emitting layer 4. In this graph, comparison is made between a configuration (illustrated by black circles) in which the molecular orientation is substantially in parallel to the electrodes 2 and 6 and another configuration (illustrated by white circles) in which the molecular orientation is substantially perpendicular to the electrodes 2 and 6. It can be seen from the graph that in the configuration of the parallel molecular orientation, the current rises at a lower voltage.

Figure 15B:
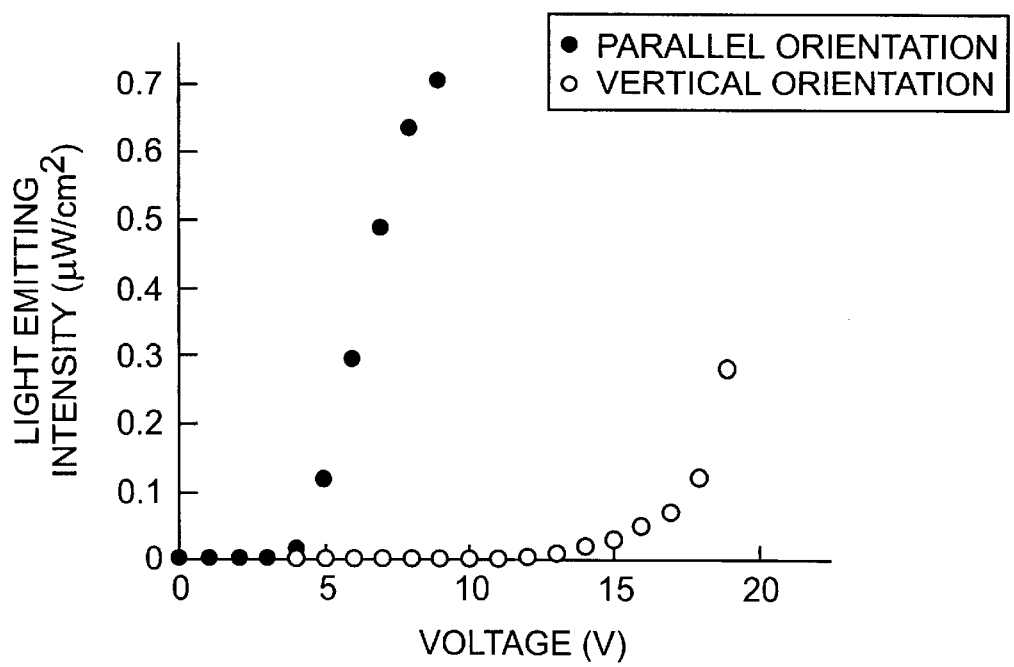
Figure 16A:
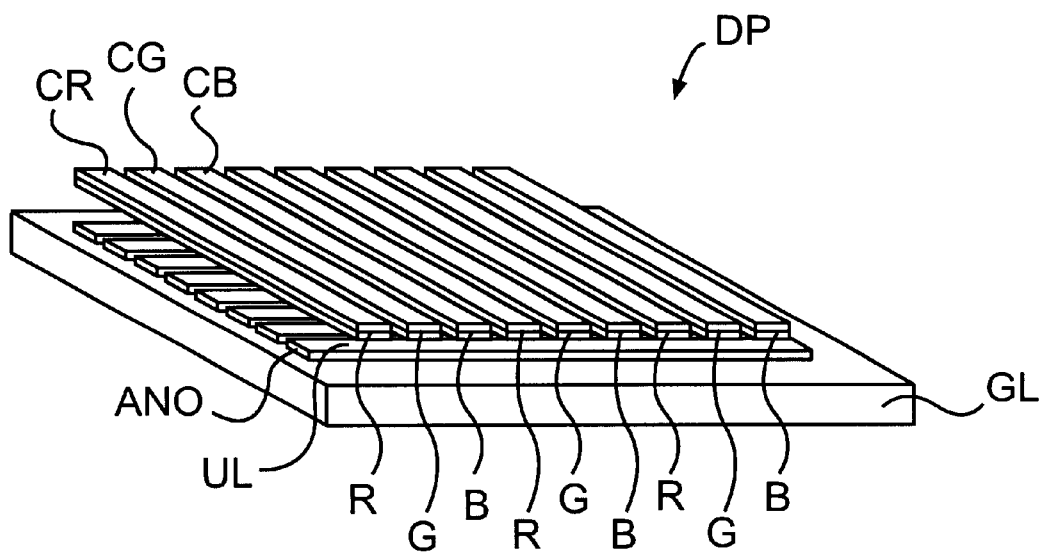
FIGS. 16A and 16B are a schematic perspective view of a conventional display panel DP of a full color image display and an equivalent circuit diagram of a unit light emitting device UL constituting the display panel DP shown in FIG. 16A, respectively.
Figure 16B:
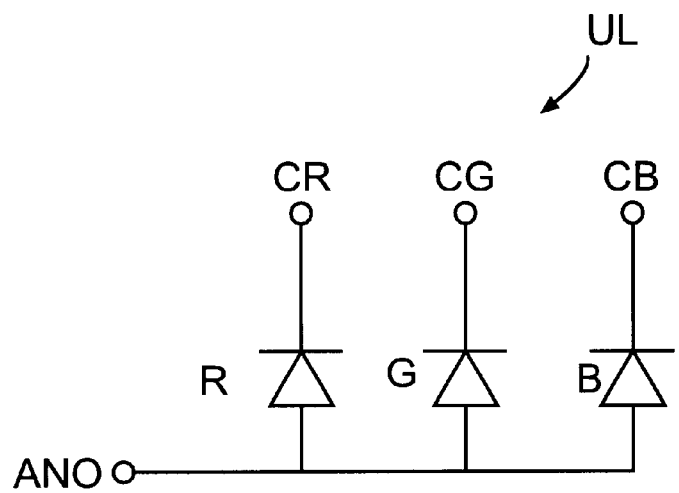
Figure 17:
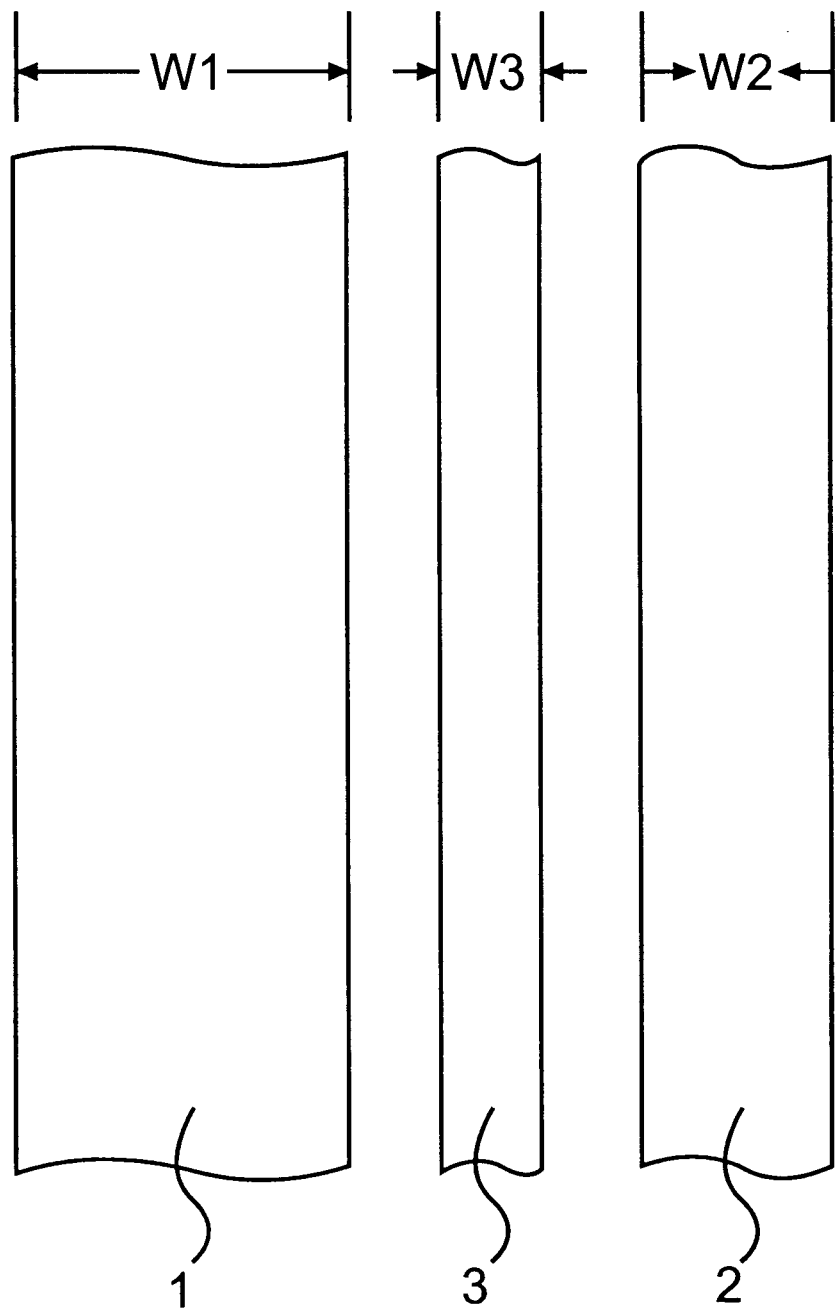
FIG. 17 is a schematic plan view for showing another conventional display panel.

FIG. 15B is a graph showing the relationship between a voltage applied between the electrodes 2 and 6 and a light emitting intensity of the blue light emitting layer 4. In this graph, comparison is made between a configuration (illustrated by black circles) in which the molecular orientation is substantially in parallel to the electrodes 2 and 6 and another configuration (illustrated by white circles) in which the molecular orientation is substantially perpendicular to the electrodes 2 and 6. It can be seen from the graph that in the configuration of the parallel molecular orientation, the light emitting intensity rises at a lower voltage.

In the examples shown in FIGS. 13–15, although reference was made to the blue light emitting element B. This substantially applies to the green light emitting element G and red light emitting element R. Further, in the examples shown in FIGS. 13–15, although reference was made to the unit light emitting device 34, this substantially applies to the unit light emitting devices 22, 30 and 32.

In each of the embodiments described above, the connecting state of each of the input terminals was configured in such a manner that the first input terminal is grounded; the connecting state of the second input terminal can be selected from the three states of being connected to a positive potential, a negative potential and connected to neither potential; and the connecting state of the third input terminal can be selected from two states of being connected to the positive or negative potential and connected to neither potential. But, it is not limited to such a configuration.

In each of the embodiments described above, although the first to third input terminals were wired to be taken out toward the side of the third electrode, the wiring positions are not limited to such a wiring location. For example, where light is taken out on the side of the third electrode, the first to third input terminals may be wired to be taken out toward the side of the first electrode.

In each of the embodiments described above, although the light emitting element which requires largest power to obtain the same luminance of the three light emitting elements is used as the third light emitting element and the light emitting element which required the larger power to obtain the same luminance is used as the first element, the present invention should not be limited to such a configuration. For example, where the order of the magnitudes of the power consumed by each of the light emitting elements to obtain the same luminance is not coincident to that of the life of each of the light emitting elements in the same luminance, the light emitting element having the shortest life for the same luminance may be used as the third light emitting element and the light emitting element having the shorter life may be used as the first light emitting element.

In each of the embodiments described above, although the three kinds of light emitting elements were stacked in three layers, they may be arranged in any other configuration. For example, the two of three kinds of light emitting elements may be stacked in two layers, the these two light emitting elements and the remaining one kind of light emitting element may be not stacked but arranged adjacently to each other. Further all the three kinds of light emitting elements may not be stacked but may be arranged adjacently to one another.

In each of the embodiments described above, although the light emitting elements emitting blue light, green light and red light were used as three kinds of light emitting elements, the kind of the light emitting elements should not be limited to these kinds. The light emitting element emitting any other color may be used. Four or more kinds of light emitting elements may be used to construct a light emitting appliance.

In each of the embodiments described above, although the light emitting element was referred to as a plane light emitting element having a light emitting layer of an organic material, it should not be limited to such a plane light emitting element. The present invention can also be applied to a plane light emitting element having a light emitting layer of inorganic material or the other light emitting element than the plane light emitting element.

In each of the embodiments described above, although the light emitting element was referred to as a light emitting element having a light emitting layer sandwiched between an anode and cathode, the present invention can be applied to a general light emitting element which is caused to emit light by the voltage applied between the anode and cathode.

In each of the embodiments described above, although the light emitting appliance was referred to as a full color display, the present invention can be also applied to a general light emitting appliance such as light emitting diode etc., which is derived by direct current.

What is claimed is:

1. A light emitting appliance comprising unit light emitting devices each composed of at least three light emitting elements which are caused to emit light by application of a voltage between respective pairs of anodes and cathodes and have substantially different emitted light colors, wherein
   a first light emitting element and a second light emitting element are coupled in series with each other to constitute a ring and coupling points of these elements are used as a first connecting point and a second connecting point, and
   a first electrode of a third light emitting element is connected to a first input terminal and a second electrode of the third light emitting element is used as a third input terminal.

2. A light emitting appliance according to claim 1, wherein the first input terminal is grounded;
   a second input terminal is connected so as to be selectable from three connecting states of being connected to a positive potential, a negative potential and neither potential; and the third input terminal is connected so as to be selectable from two connecting states of being connected to the positive or negative and neither potential.

3. A light emitting appliance according to claim 2, wherein a connecting point between the cathode of said first light emitting element and the anode of said second light emitting element is used as the first input terminal;

a connecting point between the cathode of said first light emitting element and the cathode of the second light emitting element is used as the second input terminal;

the anode of said third light emitting element is coupled with the first input terminal and the cathode of the third light emitting element is used as the third input terminal;

said first input terminal is grounded;

said second input terminal is connected so as to be selectable from three connecting states of being connected to a positive potential, a negative potential and neither potential; and said third input terminal is connected so as to be selectable from two connecting states of being connected to and not connected to the positive potential.

4. A light emitting appliance according to claim 2, wherein a connecting point between the cathode of said first light emitting element and the anode of said second light emitting element is used as the first input terminal;

a connecting point between the cathode of said first light emitting element and the cathode of the second light emitting element is used as the second input terminal; and the anode of said third light emitting element is coupled with the first input terminal and the cathode of the third light emitting element is used as the third input terminal;

said first input terminal is grounded;

said second input terminal is connected so as to be selectable from three connecting states of being connected to a positive potential, a negative potential and neither potential; and said third input terminal is connected so as to be selectable from two connecting states of being connected to and not connected to the negative potential.

5. A light emitting appliance according to claim 2, wherein a connecting point between the anode of said first light emitting element and the cathode of said second light emitting element is used as the first input terminal;

a connecting point between the cathode of said first light emitting element and the anode of the second light emitting element is used as the second input terminal; and the cathode of said third light emitting element is coupled with the first input terminal and the anode of the third light emitting element is used as the third input terminal;

said first input terminal is grounded;

said second input terminal is connected so as to be selectable from three connecting states of being connected to a positive potential, a negative potential and neither potential; and said third input terminal is connected so as to be selectable from two connecting states of being connected to and not connected to the positive potential.

6. A light emitting appliance according to claim 2, wherein a connecting point between the anode of said first light emitting element and the cathode of said second light emitting element is used as the first input terminal;

a connecting point between the cathode of said first light emitting element and the anode of the second light emitting element is used as the second input terminal; and the anode of said third light emitting element is coupled with the first input terminal and the cathode of the third light emitting element is used as the third input terminal;

said first input terminal is grounded;

said second input terminal is connected so as to be selectable from three connecting states of being connected to the positive potential, negative potential and neither potential; and said third input terminal is connected so as to be selectable from two connecting states of being connected to and not connected to the negative potential.

7. A light emitting appliance according to claim 1, wherein said three kinds of light emitting elements are stacked as three layers, and adjacent electrodes in a direction of stacking the light emitting elements are in common.

8. A light emitting appliance according to claim 7, wherein each of the three kinds of light emitting elements is a light emitting element having a light emitting layer sandwiched between respective pairs of anodes and cathodes; and the light emitting appliance formed of a stack sequentially comprising:

a first electrode serving as the first input terminal;

the light emitting layer of the first light emitting element;

a second electrode serving as the second input terminal;

the light emitting layer of the second light emitting element;

an intermediate electrode formed to be connected to the first electrode;

the light emitting layer of the third light emitting element; and a third electrode serving as the third input terminal.

9. A light emitting appliance according to claim 8, wherein said first light emitting element serves as a light emitting element for emitting blue light;

said second light emitting element serves as a light emitting element for emitting green light;

said third light emitting element serves as a light emitting element for emitting red light;

said first electrode, second electrode and intermediate electrode are made light-transmissive so that light is taken out from the side of the first electrode.

10. A light emitting appliance according to claim 8, wherein said first to third input terminals are wired so that they are taken out from the side of the third electrode.

11. A light emitting appliance according to claim 1, wherein said three kinds of light emitting elements are plane light emitting elements, each equipped with a light emitting layer of an organic material.

12. A light emitting appliance according to claim 1, wherein a potential of each of the first to third input terminals is set so that each of the first to third light emitting elements is in a selected light emitting state.

13. A light emitting appliance comprising unit light emitting devices each composed of at least three light emitting elements which are caused to emit light by application of a voltage between respective pairs of anodes and cathodes and having substantially different emitted light colors, wherein said first light emitting element and said second light emitting element are made selectively light-emittable at a predetermined time rate within a unit light emitting time, and said third light emitting element is made light-emittable during the entire unit light emitting time.

14. A light emitting appliance according to claim 13, wherein the light emitting element having the largest bias voltage to acquire the same luminance among said three light emitting elements is used as the third light emitting element.

15. A light emitting appliance according to claim 14, wherein the light emitting element providing the second larger bias voltage to acquire the same luminance among said three light emitting elements is used as the first light emitting element; and the time rate during which said first light emitting element is light-emittable within a unit light emitting time is longer than that during which said second light emitting element is light-emittable.

16. A light emitting appliance according to claim 15, wherein said time rate is defined as a period such that the average luminance of the first light emitting element within a unit light emitting time is substantially equal to the average luminance of said second light emitting element.

17. A light emitting appliance according to claim 13, wherein said first light emitting element serves as a light emitting element for emitting blue light;

said second light emitting element serves as a light emitting element for emitting green light; and said third light emitting element serves as a light emitting element for emitting red light.

18. A light emitting appliance comprising unit light emitting devices each composed of at least three organic electro-luminescence devices as a light emitting element which are caused to emit light by application of a voltage between respective pairs of anodes and cathodes and have substantially different emitted light colors, wherein a first electro-luminescence device and a second electro-luminescence device are coupled in series with each other to constitute a ring and coupling points of these devices used as a first connecting point and a second connecting point, and a first electrode of a third electro-luminescence device is connected to a first input terminal and a second electrode of the third electro-luminescence device is used as a third input terminal.

* * * * *